United States Patent
Lai

(10) Patent No.: US 11,056,619 B2
(45) Date of Patent: Jul. 6, 2021

(54) QUANTUM DOT MATERIALS AND METHOD OF MANUFACTURING THEREOF

(71) Applicant: FENG CHIA UNIVERSITY, Taichung (TW)

(72) Inventor: Chun-Feng Lai, Taichung (TW)

(73) Assignee: FENG CHIA UNIVERSITY, Taichung (TW)

( * ) Notice: Subject to any disclaimer, the term of this patent is extended or adjusted under 35 U.S.C. 154(b) by 283 days.

(21) Appl. No.: 16/238,538

(22) Filed: Jan. 3, 2019

(65) Prior Publication Data

US 2019/0348575 A1    Nov. 14, 2019

(30) Foreign Application Priority Data

May 11, 2018  (TW) ................. 107116211

(51) Int. Cl.
| | |
|---|---|
| *H01L 33/50* | (2010.01) |
| *C09K 11/02* | (2006.01) |
| *C09K 11/66* | (2006.01) |

(52) U.S. Cl.
CPC .......... *H01L 33/502* (2013.01); *C09K 11/025* (2013.01); *C09K 11/665* (2013.01); *H01L 33/505* (2013.01); *H01L 33/507* (2013.01); *H01L 2933/0041* (2013.01)

(58) Field of Classification Search
CPC ............................ C09K 11/025; C09K 11/665
See application file for complete search history.

(56) References Cited

U.S. PATENT DOCUMENTS 10,741,730 B2 *  8/2020  Mu ....................... H01L 51/502

FOREIGN PATENT DOCUMENTS

| CN | 106025042 | * 10/2016 |
| CN | 106634961 | *  5/2017 |
| CN | 108929671 | * 12/2018 |

OTHER PUBLICATIONS

Translation of CN 108929671, Dec. 4, 2018.*
Translation of CN 106025042, Oct. 12, 2016.*
Translation for CN 106634961, May 10, 1927.*

* cited by examiner

*Primary Examiner* — C Melissa Koslow
(74) *Attorney, Agent, or Firm* — Cheng-Ju Chiang

(57) ABSTRACT

A quantum dot material and a method of manufacturing quantum dot materials are provided. The method comprises a step of providing a quantum dot solution and a silicon compound, a step of introducing the quantum dot solution and the silicon compound to a cross-linking agent and an ammonia solution ($NH_4OH$) for cross-linking reaction, and a step of obtaining a quantum dot material coated with a silicon oxide ($SiO_x$) material.

16 Claims, 18 Drawing Sheets

1421

1422

1423

200a

_____
QUANTUM DOT MATERIALS AND METHOD OF MANUFACTURING THEREOF

CROSS-REFERENCE TO RELATED APPLICATION AND CLAIM OF PRIORITY

This application claims the benefit of Taiwanese Patent Application No. 107116211, filed on May 11, 2018, in the Taiwan Intellectual Property Office, the disclosure of which is incorporated herein in its entirety by reference.

1. Technical Field

At least one embodiment of the present invention relates to quantum dot materials and methods of manufacturing such quantum dot materials. More particularly, the quantum dot materials are characterized by their high thermal stability and high luminous efficiency, and the methods are to manufacture such quantum dot materials.

2. Description of the Related Art

Phosphors and quantum dots are the luminescent materials which have been widely accepted by the industry. The phosphors have undergone a long history and nearly reached market saturation recently. Phosphors are criticized for their full width at half maximum (FWHM) as being too wide, and it has been too long without any breakthrough in this technology. The applications of phosphors are thus limited to some devices. Currently, developing quantum dot techniques is the latest tread in both the academy and industry.

The particle sizes of nanomaterials are usually between 1 nm and 100 nm, and can be further classified into subgroups based on their size. Semiconductor nanocrystals (NCs) are also known as quantum dots (QDs), which are classified as zero-dimension nanomaterials because of their particle sizes. The nanomaterials can be applied to fields including light-emitting diodes (LEDs), solar panels, biomarkers, etc. The characteristics of nanomaterials are currently under intensive optical, electrical, and magnetic study.

Among all the properties of quantum dots, its narrow FWHM draws large attentions from the public and are expected to conquer the disadvantages of phosphors. The application of quantum dots in LED devices may bring superior products with wide color gamut (WCG).

SUMMARY

Some embodiments of the present invention provide quantum dot materials and the methods of manufacturing such quantum dot materials.

Some embodiments of the present invention provide a quantum dot material comprises at least one quantum dot and a silicon oxide (SiOx) material covering on the at least one quantum dot. More particularly, the at least one quantum dot is a perovskite quantum dot characterized by the general formula $MAX_3$.

In the aforementioned embodiments, the at least one quantum dot, characterized by the general formula $MAX_3$, is one selected from the group consisting of an organic-inorganic hybrid perovskite quantum dot, an all-inorganic perovskite quantum dot, and the combination thereof. Of the general formula, the cation M is an organic cation (e.g., a methylamine cation, an ethylamine cation, a formamidine cation) or an inorganic cation (e.g., a cesium cation). The metal ion A is a divalent lead ion ($Pb^{2+}$), a divalent tin ion ($Sn^{2+}$), or a divalent germanium ion ($Ge^{2+}$). The halide ion X is a chloride ion ($Cl^-$), a chloride ion ($Br^-$), or an iodide ion ($I^-$) in a cubic, orthorhombic, or tetragonal crystal system.

As for the all-inorganic perovskite quantum dot, it is one selected from the group consisting of a green all-inorganic perovskite quantum dot characterized by the general formula $CsPbBr_3$ and capable of emitting green light, an amber all-inorganic perovskite quantum dot characterized by the general formula $CsPb(I/Br)_3$ and capable of emitting amber light, a red all-inorganic perovskite quantum dot characterized by the general formula $CsPbI_3$ and capable of emitting red light, and the combination thereof.

On the other hand, the silicon oxide material is made of silicon dioxide ($SiO_2$).

Some other embodiments of the present invention provide a method of manufacturing quantum dot materials. The method comprises a step of providing a quantum dot solution having a first volume and a silicon compound having a second volume, a step of introducing the quantum dot solution and the silicon compound to a cross-linking agent and an ammonia solution ($NH_4OH$) having a third volume, and a step of obtaining a quantum dot material coated by a silicon oxide (SiOx) material.

In the aforementioned embodiments, the quantum dot solution comprises perovskite quantum dots characterized by the general formula $MAX_3$. The perovskite quantum dot is one selected from the group consisting of an organic-inorganic hybrid perovskite quantum dot, an all-inorganic perovskite quantum dot, and the combination thereof.

The silicon compound is tetraethyl orthosilicate (TEOS), tetramethyl orthosilicate (MEOS), or 3-aminopropyltriethoxysilane (APTES).

The cross-linking agent is prepared by dissolving polyoxyethylene (5) nonylphenyl ether (i.e., Igepal CO-520) in cyclohexane or dissolving polyoxyethylene (5) nonylphenyl ether (i.e., Igepal CO-520) in hexane.

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

DESCRIPTION OF THE PREFERRED EMBODIMENTS

Figure 1:
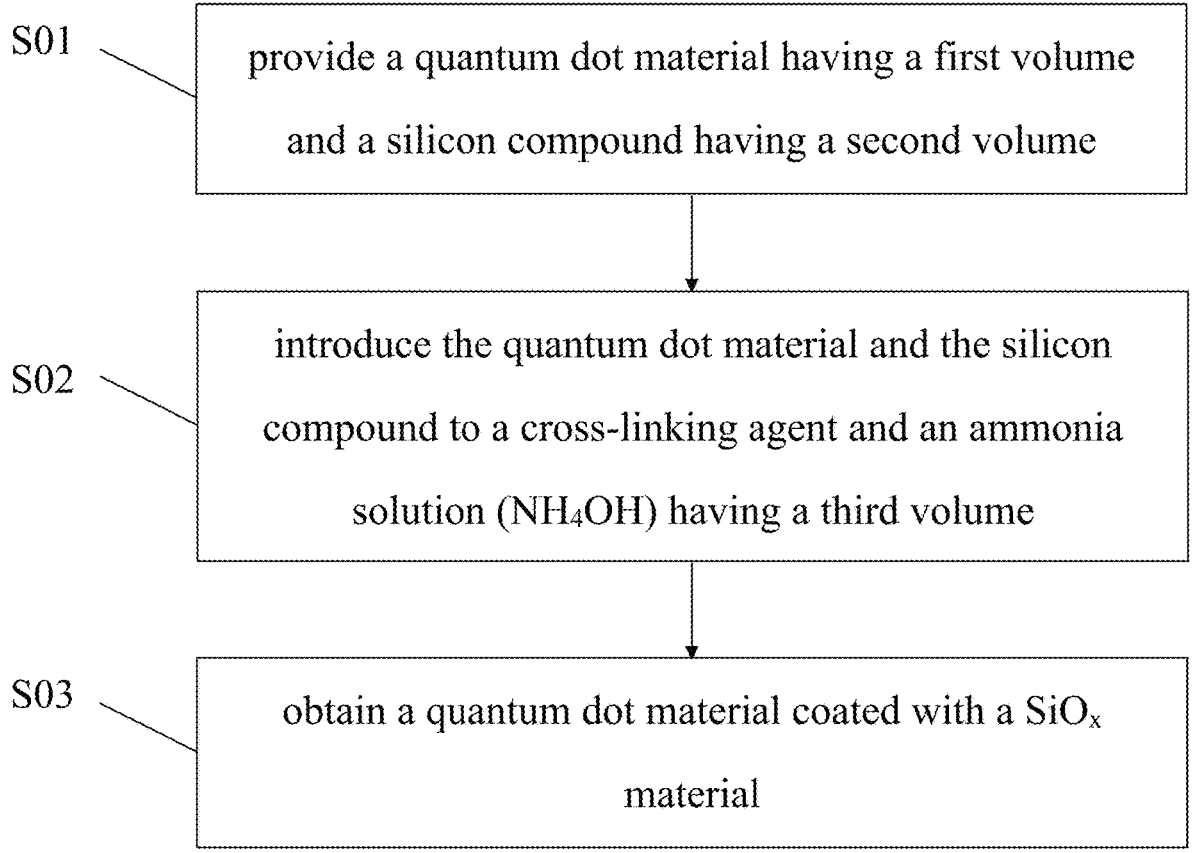
FIG. 1 is a flow chart illustrating a method of manufacturing quantum dot materials, in accordance with some embodiments of the present invention.

The drawings disclose some preferred embodiments of the present invention, which are intended to be used with the descriptions herein to enable one skilled in the art to understand the claimed features, as well as to make and use the claimed invention.

Some embodiments of the present invention provide quantum dot materials and the methods of manufacturing such quantum dot materials. A quantum dot material comprises at least one perovskite quantum dot, in which the at least one perovskite quantum dot is characterized by its emission spectrum only can be found in short FWHM materials, as well as its purity in color reproduction. The $SiO_x$ material covering on the at least one perovskite quantum dot, on the other hand, boosts the quantum efficiency, thermal stability, and optical efficiency of the quantum dot material.

In some embodiments, the quantum dot material comprises at least one quantum dot and a $SiO_x$ material coating on the at least one quantum dot in a spherical shape.

The at least one quantum dot is a perovskite quantum dot characterized by the general formula, $MAX_3$. The perovskite quantum dot is an organic-inorganic hybrid perovskite quantum dot, an all-inorganic perovskite quantum dot, or the combination thereof. Of the above formula, the cation M is an organic cation (including a methylamine cation, an ethylamine cation, and a formamidine cation) or an inorganic cation (including a cesium cation). The metal ion A is a divalent lead ion ($Pb^{2+}$), a divalent tin ion ($Sn^{2+}$), or a divalent germanium ion ($Ge^{2+}$). The halide ion X is a chloride ion ($Cl^-$), a chloride ion ($Br^-$), or an iodide ion ($I^-$) in a cubic, orthorhombic, or tetragonal crystal system.

More particularly, the all-inorganic perovskite quantum dot is a green all-inorganic perovskite quantum dot characterized by the general formula $CsPbBr_3$ and capable of emitting green light, an amber all-inorganic perovskite quantum dot characterized by the general formula $CsPb(I/Br)_3$ and capable of emitting amber light, a red all-inorganic perovskite quantum dot characterized by the general formula $CsPbI_3$ and capable of emitting red light, or their combination. The quantum dot material in an embodiment can be excited by a first beam and then emits a second beam in another wavelength. In such conversion in wavelength, the quantum dot material exhibits high quantum efficiency and high conversion efficiency. It also exhibits the emission spectrum unique to narrow FWHM materials and high purity in color reproduction. The beneficial characteristics of such quantum dot material are ideal for lighting devices, as it provides higher luminous efficiency.

Moreover, different compositions of the at least quantum provide different light colors (i.e., the wavelength of the second beam) based on the band gaps. For example, changing the composition in material and/or particle size may thus generates a variety of colors from blue, green, to red color gamut. Such characteristic renders the application of the quantum dot material flexible.

The size of the at least quantum dot is in a nanoscale. In this embodiment, the at least one quantum dot is between 1 nm and 30 nm in size (e.g., 20 nm).

Moreover, the thickness of the SiOx material is between 1 nm and 1000 nm; or between 10 nm and 100 nm in some other embodiments. The SiOx material is made of silicon monoxide (SiO) or silicon dioxide ($SiO_2$). The high transparency of $SiO_2$ minimizes the loss of light and avoids impairing the luminous efficiency of the at least one quantum dot. By leaving the ligands on the at least one quantum dot available, the quantum efficiency can be significantly elevated.

In this embodiment, the quantum dot material (i.e., including both the at least one quantum dot and the $SiO_x$ material) is between 30 nm and 1000 nm in size (e.g., between 30 nm and 150 nm). In some preferred embodiments, the size of the quantum dot material is 30 nm.

The quantum dot material in the aforementioned embodiments is versatile, it is suitable to be used in fields like wavelength convertors, luminous devices, and photovoltaic cells in different industries. For example, the quantum dot material can be applied to the packaging of LED, the packaging of micro LED, QD-LEDs, plant growing lights, displays, solar panels, bio-labels, image detectors, NVIS, etc. The quantum dot material of this embodiment is characterized by its superior luminous efficiency and stability. As such, the quantum dot material can substantially sustain the durability and stability of products.

Moreover, some other embodiments of the present invention provide a method of manufacturing quantum dot materials.

FIG. 1 is a flow chart illustrating a method of manufacturing quantum dot materials, in accordance with some embodiments of the present invention. The method comprises: a step of providing a quantum dot solution having a first volume and a silicon compound having a second volume (S01), a step of introducing the quantum dot solution and the silicon compound to a cross-linking agent and an ammonia solution ($NH_4OH$) having a third volume to initiate the cross-linking reaction (S02), and a step of obtaining a quantum dot material coated with a SiOx material (S03).

In FIG. 1, the quantum dot material comprises at least one quantum dot and a $SiO_x$ material, in which the $SiO_x$ material is surrounding the at least one quantum dot material. The range of at least one quantum dot material is between 0.001 wt % and 10 wt % in the quantum dot material.

The at least one quantum dot is characterized by the general formula $MAX_3$. It may be any of an organic-inorganic hybrid perovskite quantum dot, an all-inorganic perovskite quantum dot, and the combination of both. Of the general formula, the cation M is an organic cation (e.g., a methylamine cation, an ethylamine cation, a formamidine cation) or an inorganic cation (e.g., a cesium cation). The metal ion A is a divalent lead ion ($Pb^{2+}$), a divalent tin ion ($Sn^{2+}$), or a divalent germanium ion ($Ge^{2+}$). The halide ion X is a chloride ion ($Cl^-$), a chloride ion ($Br^-$), or an iodide ion ($I^-$) in a cubic, orthorhombic, or tetragonal crystal system.

The all-inorganic perovskite quantum dot could be a green all-inorganic perovskite quantum dot characterized by the general formula $CsPbBr_3$ and capable of emitting green light, an amber all-inorganic perovskite quantum dot characterized by the general formula $CsPb(I/Br)_3$ and capable of emitting amber light, a red all-inorganic perovskite quantum dot characterized by the general formula $CsPbI_3$ and capable of emitting red light, or the combination of the above.

The SiOx material can be made of silicon monoxide (SiO) or silicon dioxide ($SiO_2$). The silicon compound may be tetraethyl orthosilicate (TEOS), tetramethyl orthosilicate (MEOS), or 3-aminopropyltriethoxysilane (APTES). Specifically, TEOS is the preferred silicon compound among them. As for the cross-linking agent, it may be polyoxyethylene (5) nonylphenyl ether (i.e., Igepal CO-520) which is dissolved in cyclohexane or in hexane.

In one embodiment, the method of manufacturing quantum dot material is as the following. In the first step, a first volume (i.e., 5 ml) of a quantum dot solution and a second volume (i.e., 600 µl) of TEOS solution are provided. The quantum dot solution and the TEOS solution are then mixed with a third volume (i.e., 800 µl) of ammonia solution ($NH_4OH$) and a cross-linking agent. The cross-linking agent in this embodiment is a solution of 920 mg of polyoxyethylene (5) nonylphenyl ether (i.e., Igepal CO-520) dissolved in 18 ml of cyclohexane. After 48 hours, a quantum dot material covering with the $SiO_x$ material is formed.

Figure 2:
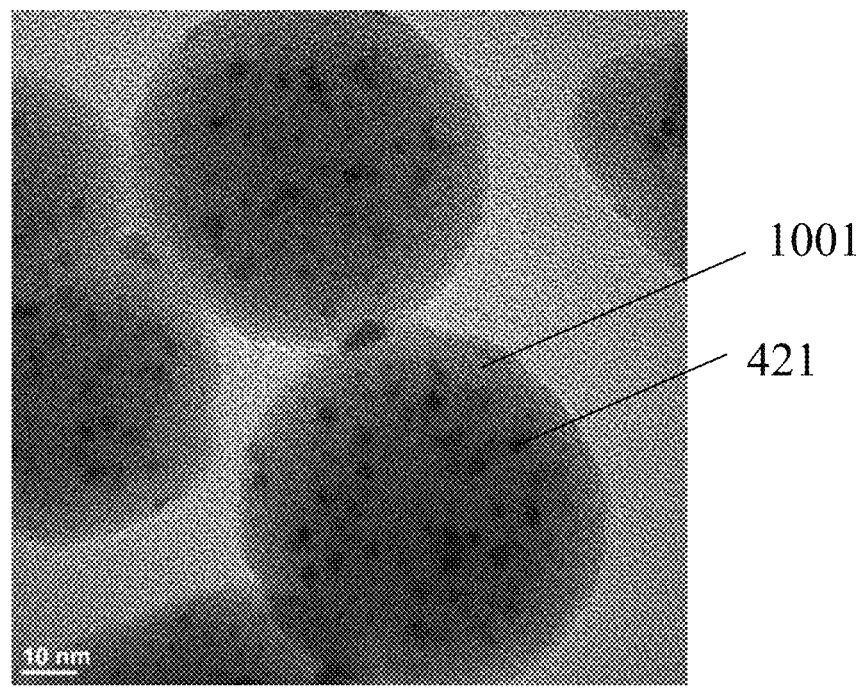
FIG. 2 is an image of the first quantum dot material, in accordance with one embodiment of the present invention.

FIG. 2 is an image of the first quantum dot material, in accordance with the embodiment above. The basic unit of FIG. 2 is 10 nm. In FIG. 2, the size of the quantum dot material 1421 is 65 nm, in which each quantum dot material 1421 comprises multiple quantum dots 421 and a $SiO_x$ material 1001 covering on the multiple quantum dots 421.

In another embodiment, the method of manufacturing quantum dot material is as the following. In the first step, a first volume (i.e., 5 ml) of a quantum dot solution and a second volume (i.e., 600 µl) of TEOS solution are provided. The quantum dot solution and the TEOS solution are then mixed with a third volume (i.e., 800 µl) of ammonia solution ($NH_4OH$) and a cross-linking agent. The cross-linking agent in this embodiment is a solution of 920 mg of polyoxyethylene (5) nonylphenyl ether (i.e., Igepal CO-520) dissolved in 18 ml of cyclohexane. After 72 hours, a quantum dot material covering with the $SiO_x$ material is formed.

Figure 3:
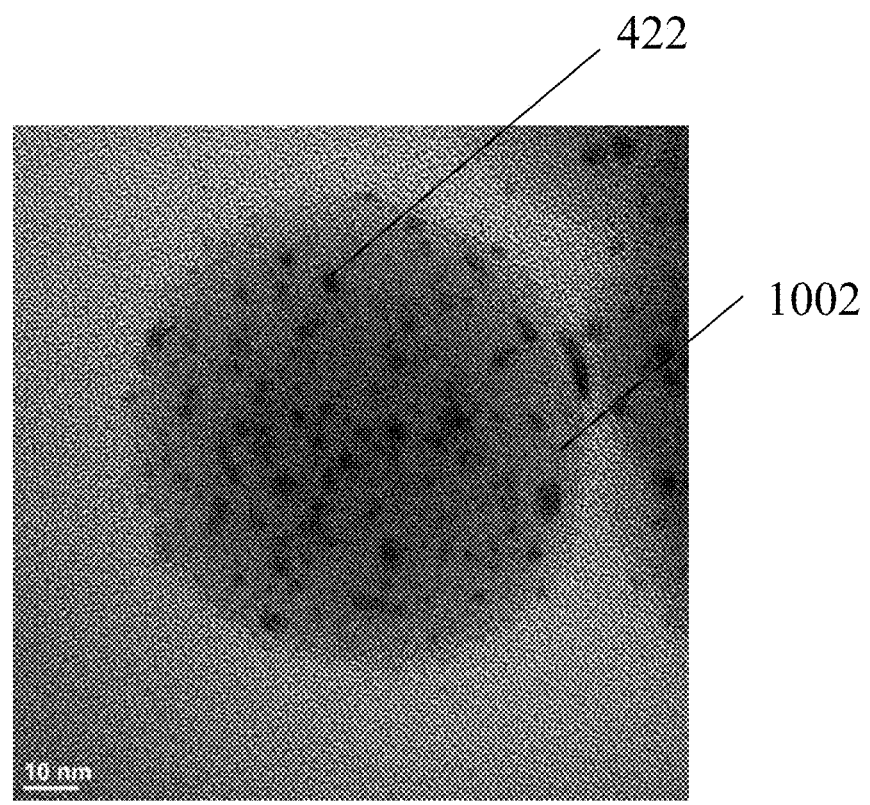
FIG. 3 is an image of the second quantum dot material, in accordance with one embodiment of the present invention.

FIG. 3 is an image of the second quantum dot material, in accordance with the embodiment above. The basic unit of FIG. 3 is 10 nm. In FIG. 3, the size of the quantum dot material 1422 is 80 nm, in which each quantum dot material 1422 comprises multiple quantum dots 422 and a $SiO_x$ material 1002 covering on the multiple quantum dots 422.

In yet another embodiment, the preferred embodiment, the method of manufacturing quantum dot material is as the following. In the first step, a first volume (i.e., 10 ml) of a quantum dot solution and a second volume (i.e., 2 ml) of TEOS solution are provided. The quantum dot solution and the TEOS solution are then mixed with a third volume (i.e., 2 ml) of ammonia solution ($NH_4OH$) and a cross-linking agent. The cross-linking agent in this embodiment is a solution of 2.3 g of polyoxyethylene (5) nonylphenyl ether (i.e., Igepal CO-520) dissolved in 45 ml of cyclohexane. After 24 hours, a quantum dot material covering with the $SiO_x$ material is formed.

Figure 4:
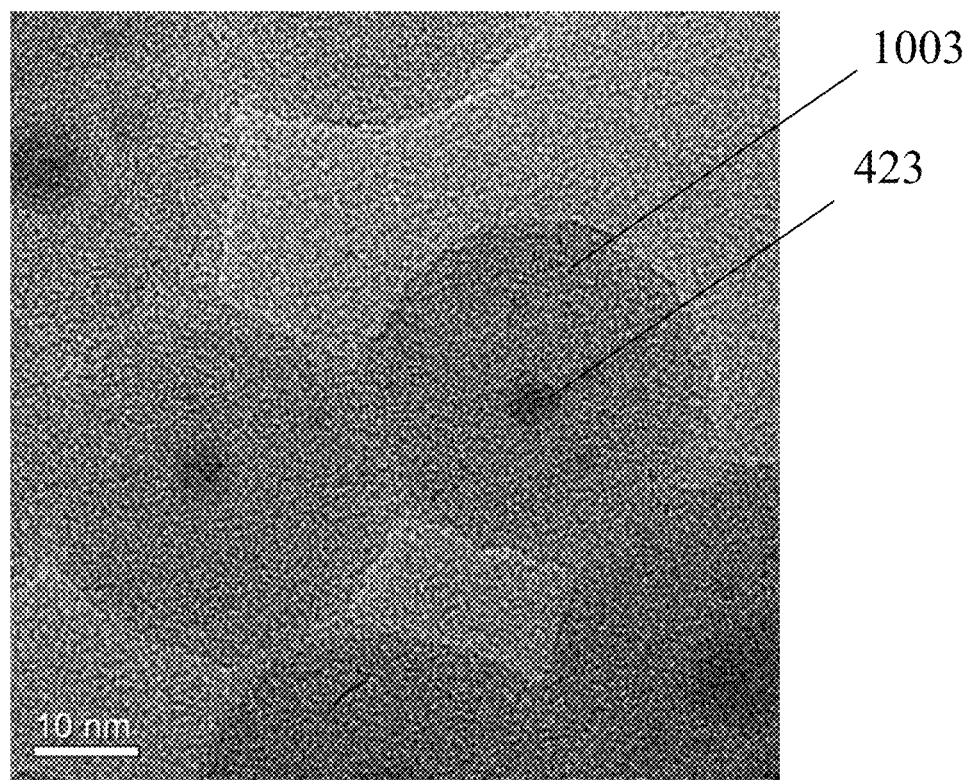
FIG. 4 is an image of the third quantum dot material, in accordance with one embodiment of the present invention.

FIG. 4 is an image of the third quantum dot material, in accordance with the embodiment above. The basic unit of FIG. 4 is 10 nm. In FIG. 4, the size of the quantum dot material 1423 is 30 nm, in which each quantum dot material 1423 comprises multiple quantum dots 423 and a $SiO_x$ material 1003 covering on the multiple quantum dots 423.

The quantum dot materials disclosed in the above embodiments are suitable for using in luminous devices such as lighting systems, luminous modules (including the front light and light modules) such as phone screens and TV screens, as well as the pixels and the sub-pixels of display panels. As a more complicated composition of quantum dots is used, a higher change to cover the full spectrum is present in light of the fact that more emission wavelengths can be provided by the variety of quantum dots. Accordingly, the quantum dot materials disclosed by theses embodiments can provide a display with a more completed color gamut and increase the purity and fidelity of the colors displaying on screens.

Figure 5:
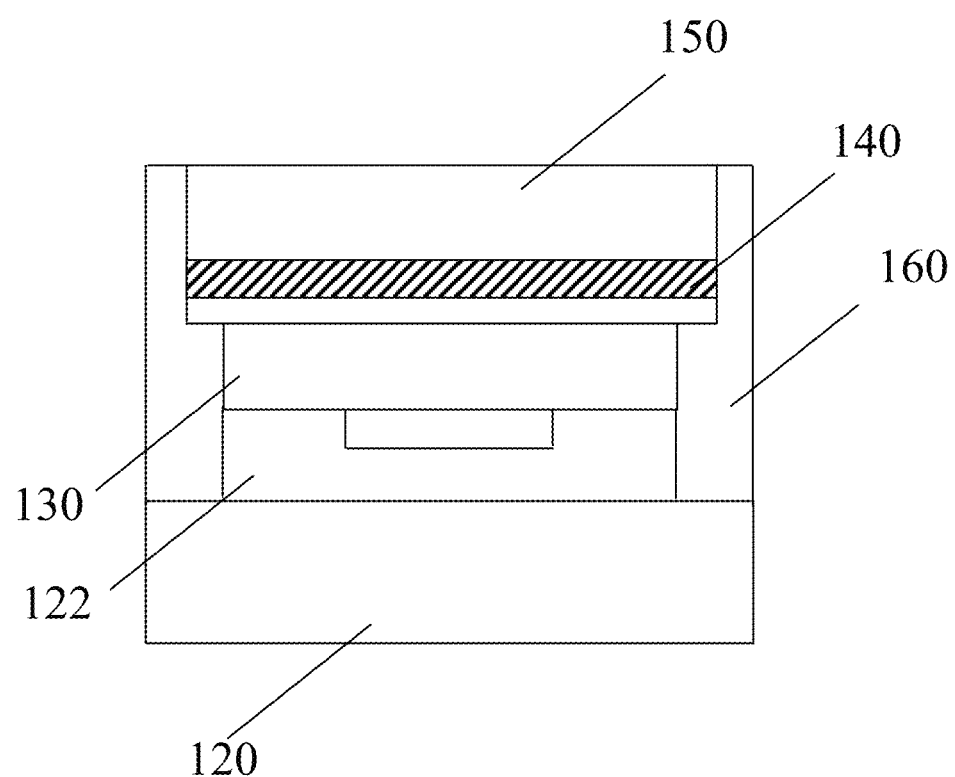
FIG. 5 is a schematic diagram illustrating the first QD-LED packaging, in accordance with some embodiments of the present invention.

FIG. 5 is a schematic diagram illustrating the first QD-LED packaging, in accordance with some embodiments of the present invention. The QD-LED 100a is packaged as a chip, in which the QD-LED 100a comprises a substrate 120, a metal electrode 122, an LED chip 130, a wavelength conversion film 140, and a barrier layer 150. At the both sides of the metal electrode 122, the LED chip 130, the wavelength conversion film 140, and the barrier layer 150, protective layers 160 may be disposed to prevent the infiltration of steam (water in the gas phase) and oxygen.

The bottom of the QD-LED 110a is the substrate 120. The metal electrode 122 is configured on the substrate 120, in which the LED chip 130 is configured on the metal electrode 122 and electrically connected to the metal electrode 122. Both the wavelength conversion film 140 and the barrier layer 150 are configured on the LED chip 130. More particularly, the wavelength conversion film 140 is between the barrier layers 150, in order to prevent the interference by the heat generated the LED chip 130 on the conversion efficiency and integrity of the wavelength conversion film 140. In FIG. 5, the barrier layer 150 is made of polymethyl methacrylate (PMMA), optical glasses, epoxy, or silicone resins.

Of FIG. 5, the wavelength conversion film 140 comprises the quantum dot material 1421, 1422, 1423 (refer to FIG. 1 to FIG. 3). In some other embodiments, a layer of wavelength conversion complex may be used, in which the layer of wavelength conversion complex is made of the wavelength conversion film 140 including quantum dot material 1421, 1422, 1423 and a transparent gel (not shown). In such embodiments, the transparent gel may be made of polymathic methacrylate (PMMA), polyethylene terephthalate (PET), polystyrene (PS), polypropylene (PP), polyamide (PA), polycarbonate (PC), epoxy, silicone resin, silicone, or any combination of the above.

The layer of wavelength conversion complex may further include phosphorous materials (not shown). That is, the layer of wavelength conversion complex is a mixture of the aforementioned quantum dot material and an organic or inorganic phosphorous material. Examples of the inorganic phosphorous material include aluminate phosphors (e.g., LuYAG, GaYAG, and YAG), silicate phosphors, sulfide phosphors, nitride phosphors, fluoride phosphors, and $Mn^{4+}$ (KSF) phosphors. Examples of the organic phosphorous material include some monomer, polymer, and oligomer structures. The phosphorous material comprises a host lattice, an activator, and a co-activator. The color the phosphorous material may be in yellow, blue, green, orange, red, or any combination of the above (e.g., nitride phosphors in yellowish orange or yellowish red), and made of organic phosphors, inorganic phosphors, fluorescent pigments, radiative elements, or any combination of the above.

In one embodiment of FIG. 5, the method of manufacturing such wavelength conversion film 140 is disclosed in this section. In step A, a quantum dot material is dissolved and dispersed by either polar solvents or non-polar solvents to form a solution. In the next step, step B, the solution is thoroughly mixed with a transparent gel and then baked in a baker to form a quantum dot gel. In step C, the quantum dot gel is spread on a transparent substrate by knife coating or infiltrated into the space between two adjacent transparent substrates. In the final step, step D, the quantum dot gel is cured by UV light or heat to form a wavelength conversion film 140.

In such embodiment, another method of manufacturing such wavelength conversion film 140 is disclosed in this section. In step A, a plurality of nanospheres form a periodic or non-periodic stacking structure. In the next step B, a frame-gel infiltrates into an interspace of the stacking structure, in which the frame-gel comprises the aforementioned quantum dot material. In step C, the frame-gel is cured and a cleanser is used to remove the plurality of nanospheres in the stacking structure. In the final step, step D, a wavelength conversion film 140 having a nano-scale spherical cavity structure which is periodic or non-periodic is obtained.

Of the above method, a subsequent step E to fill the nano-scale spherical cavity structure of the wavelength conversion film 140 with the aforementioned quantum dot material is desired if a higher light intensity in some other wavelengths is required.

In such embodiment of FIG. 5, yet another method of manufacturing such wavelength conversion film 140 is disclosed in this section. In step F, multiple aforementioned quantum dot materials are stacked periodically or non-periodically. In the next step, step G, a frame-gel infiltrates into the stacking structure and fills the interspace therein. In step H, the frame-gel is cured. In the final step, step I, a wavelength conversion film 140 is obtained, in which the wavelength conversion film 140 has multiple quantum dot materials arranged in periodic or non-periodic stacking structure.

In another embodiment of FIG. 5, the method of manufacturing such wavelength conversion film 140 is disclosed in this section. In step A1, a plurality of nanospheres form a periodic or non-periodic stacking structure. In the next step, step B1, a frame-gel infiltrates into an interspace of the stacking structure, in which the frame-gel comprises the aforementioned quantum dot material, phosphorous material, transparent gel, or any combination of the above. In step C1, the frame-gel is cured and a cleanser is used to remove the plurality of nanospheres in the stacking structures. In the final step, step D1, a wavelength conversion film 140 having a nano-scale spherical cavity structure which is periodic or on-periodic is obtained.

Of the above method, a subsequent step E1 to fill the nano-scale spherical cavity of the wavelength conversion film 140 with the aforementioned quantum dot material is desired if a higher light intensity in some other wavelengths is required.

In both embodiments above, the plurality of nanospheres may be made of $SiO_2$, polystyrene (PS), polydimethylsiloxane, or polymethylmethacrylate, and the diameter of the multiple nanoparticles is between 10 nm and 1000 nm.

The frame-gel may be a light-activated material or heat-activated material, either with or without the fluorescent material. Exemplary light-activated materials include acrylate monomers, acrylate oligomers, and the combination of both. The acrylate monomers are preferred in embodiments, based on its characteristics including the durability, transparency, strength, and color retention. The acrylate monomers may be tripropylene glycol diacrylate (TPGDA), neopropylene glycol diacrylate (NPGDA), propoxylated neopropylene glycol diacrylate (PO-NPGDA), trimethylolpropane triacrylate (TMPTA), ethoxylated trimethylolpropane triacrylate (EO-TMPTA), propoxylated trimethylolpropane triacrylate (PO-TMPTA), propoxylated glyceryl triacrylate (GPTA), di-trimethylolpropane tetraacrylate (di-TMPTA), ethoxylated pentaerythritol tetraacrylate (EO-PETA), dipentaerythritol hexaacrylate (DPHA), or any combination of the above.

The process to cure a frame-gel is selected by the nature of the frame-gel. For example, a frame-gel containing light-curing additives is treated with UV light to activate the reaction; a frame-gel containing heat-curing additives is baked to activate the reaction.

If the plurality of nanospheres are made of $SiO_x$, the cleanser may be a hydrogen fluoride (HF) solution. Ideally, the cleanser can remove the plurality of nanospheres without degrading the frame-gel. As such, organic solutions may be used as the cleanser if the plurality of nanospheres are made of polymers.

In the embodiments, the manufacturing of the LED chip 130 can be categorized into three stages. The first stage includes forming substrates (e.g., sapphire substrate, ceramic substrate, and metal substrate), generating monocrystalline ingots (e.g., GaN, GaAs, and GaP), producing wafers, designing circuits, and growing epitaxy. The second stage comprises metal depositions, photolithography, heat treatments, and cutting. As for the last stage, the package stage, it includes flip-chip, surface mount device (SMD), and chip sale package (CSP).

In FIG. 5, the quantum dot material in the wavelength conversion film 140 (or the layer of wavelength conversion complex) of the QD-LED 100*a* can be excited by the first beam emitted by the LED chip 130, and then emits a second beam in another wavelength. In such conversion, the quantum dot material exhibits high quantum efficiency and conversion efficiency. It also shows the emission spectrum unique to narrow FWHM materials and high purity in color reproduction. The beneficial characteristics of such quantum dot material are ideal for lighting devices, as it provides higher luminous efficiency. In the present embodiments, the LED chip 130 emitting the first beam is a blue LED chip or a UV LED chip.

Figure 6:
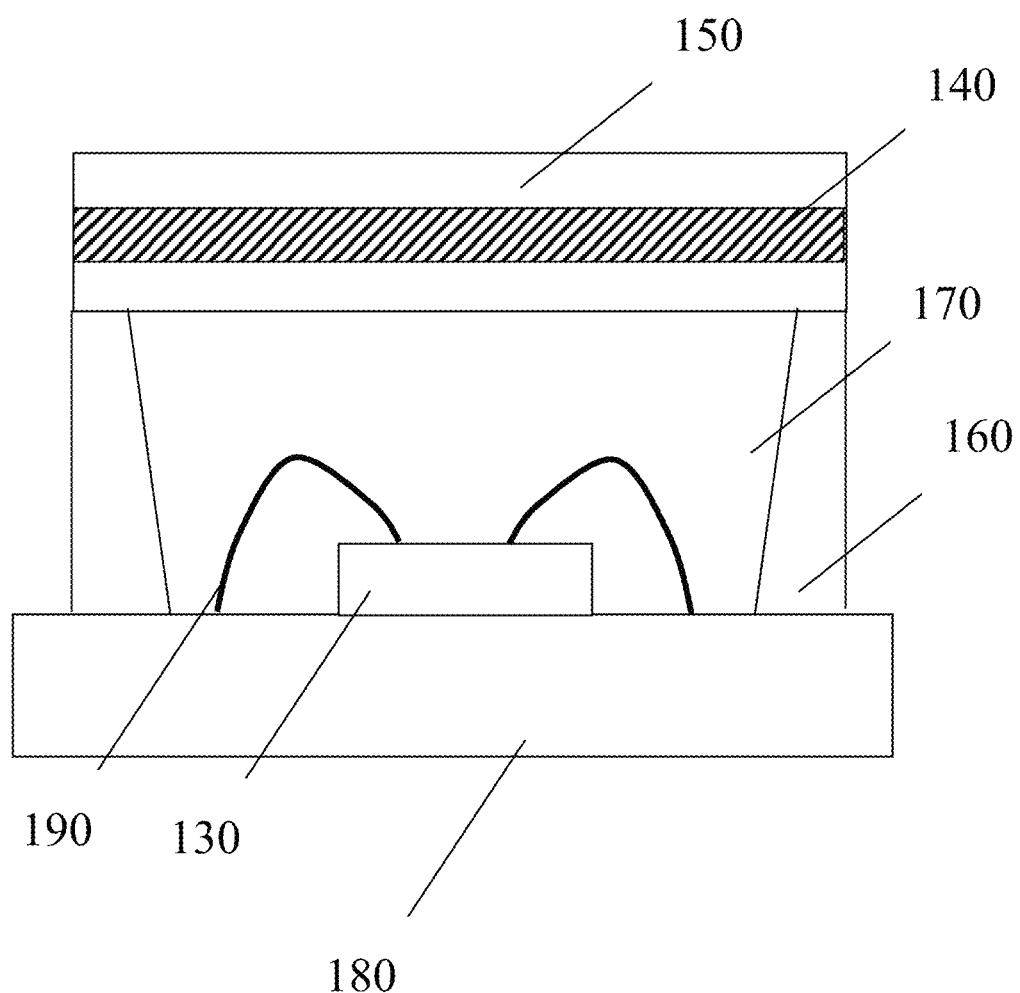
FIG. 6 is a schematic diagram illustrating the second QD-LED packaging, in accordance with some embodiments of the present invention.

FIG. 6 is a schematic diagram illustrating the second QD-LED packaging, in accordance with some embodiments of the present invention. In FIG. 6, the LED chip 130 of a QD-LED 100b is configured on a plastic leaded chip carrier 180 (connected via metal wires 190). A protective layer 160 is surrounding the structure to isolate the interior components from steam and oxygen. Moreover, a transparent gel 170 is filled in the protective layer 160. Such transparent gel 170 may be made of polymathic methacrylate (PMMA), polyethylene terephthalate (PET), polystyrene (PS), polypropylene (PP), polyamide (PA), polycarbonate (PC), epoxy, silicone resin, silicone, or any combination of the above. In the present embodiments, the transparent gel 170 is silicone resin. Atop the protective layer 160 and the transparent gel 170 is a wavelength conversion film 140 sandwiched by barrier layers 150.

Figure 7:
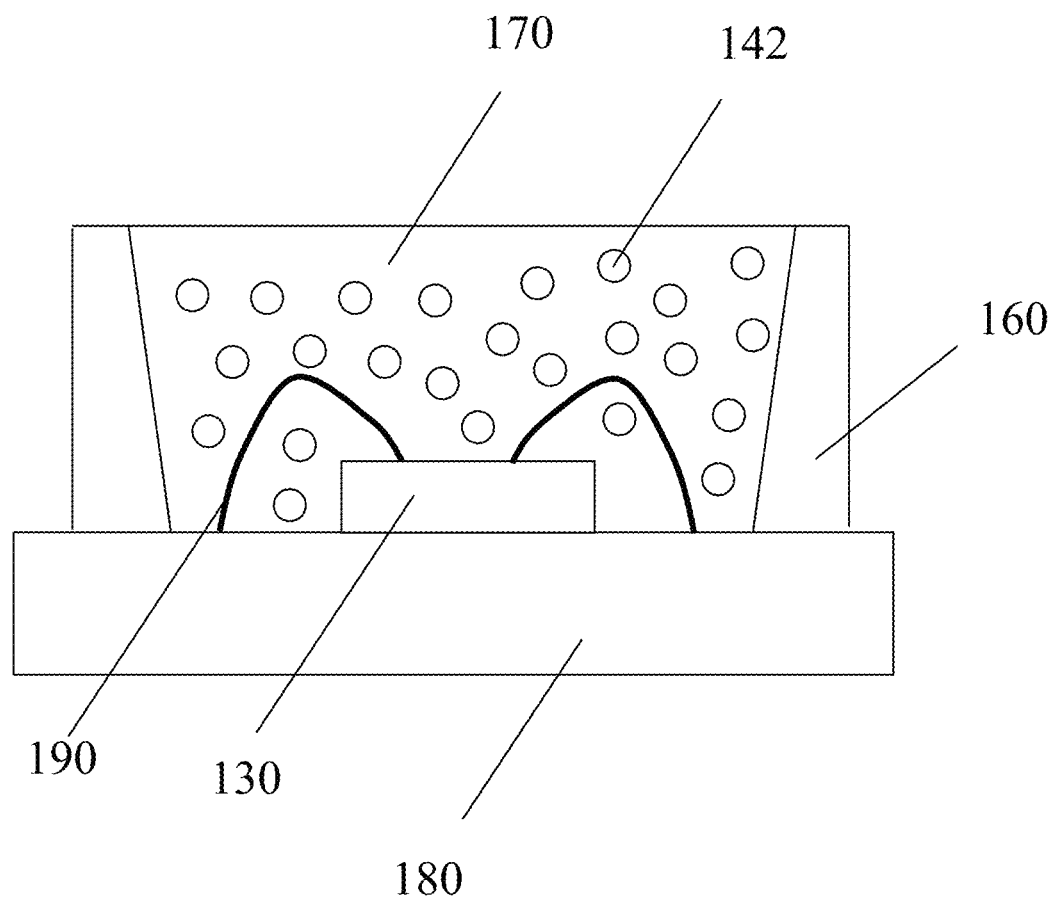
FIG. 7 is a schematic diagram illustrating the third QD-LED packaging, in accordance with some embodiments of the present invention.

FIG. 7 is a schematic diagram illustrating the third QD-LED packaging, in accordance with some embodiments of the present invention. In FIG. 7, the LED chip 130 of a QD-LED 100c is configured on a plastic leaded chip carrier 180 (connected via metal wires 190). A protective layer 160 is surrounding the structure to isolate the interior components from steam and oxygen. Moreover, a mixture of a quantum dot material 142 and a transparent gel 170 is filled within the protective layer 160. Such transparent gel 170 may be made of polymathic methacrylate (PMMA), polyethylene terephthalate (PET), polystyrene (PS), polypropylene (PP), polyamide (PA), polycarbonate (PC), epoxy, silicone resin, silicone, or any combination of the above.

Figure 8:
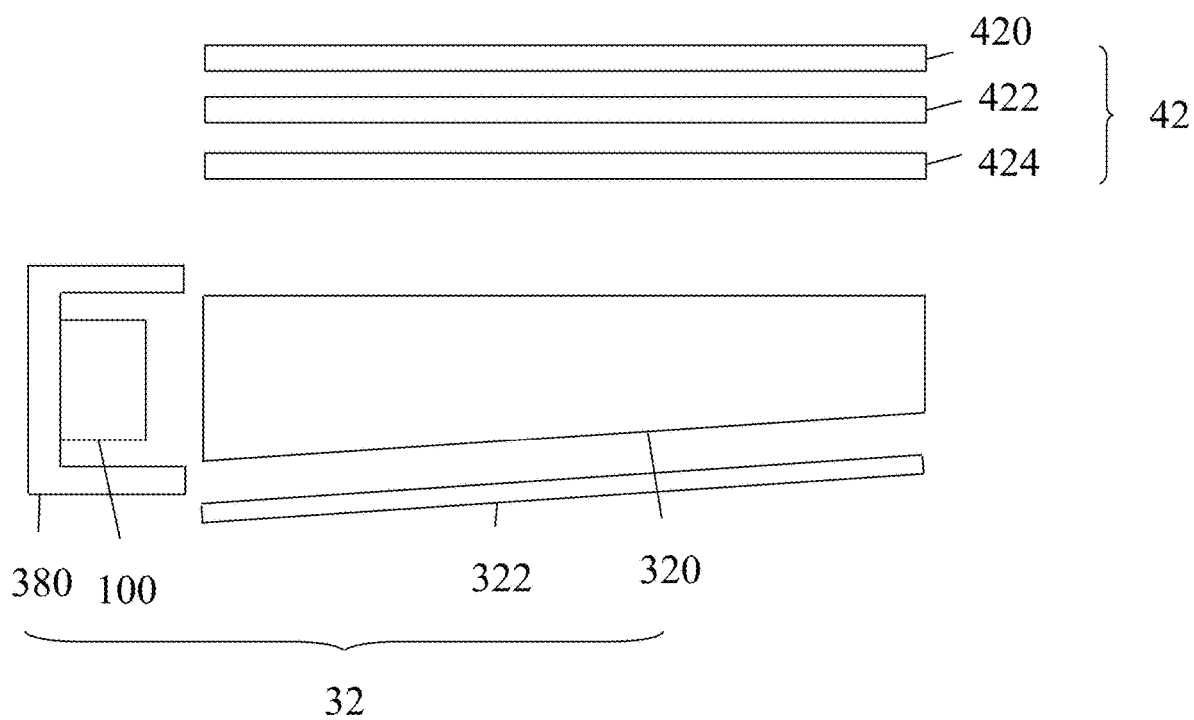
FIG. 8 is the schematic diagram illustrating a QD-LCD, in accordance with one embodiment of the present invention.

FIG. 8 is the schematic diagram illustrating a QD-LCD, in accordance with one embodiment of the present invention. The QD-LCD 52 has an edge-lit module 32 and an LCD 42. The edge-lit module 32 comprises a frame 380, a backlight unit 100, and a light guide plate 320. In the present embodiments, the backlight unit 100 may be any QD-LED 100a, 100b, 100c of FIG. 5-7, and projecting light to the input of the light guide plate 320. Moreover, the edge-lit module 32 has a reflector 322 to reflect the light from the backlight unit 100 toward the light guide plate 320. After receiving the light, the light guide plate 320 guides the light to the LCD 42 through its outlet.

Figure 9:
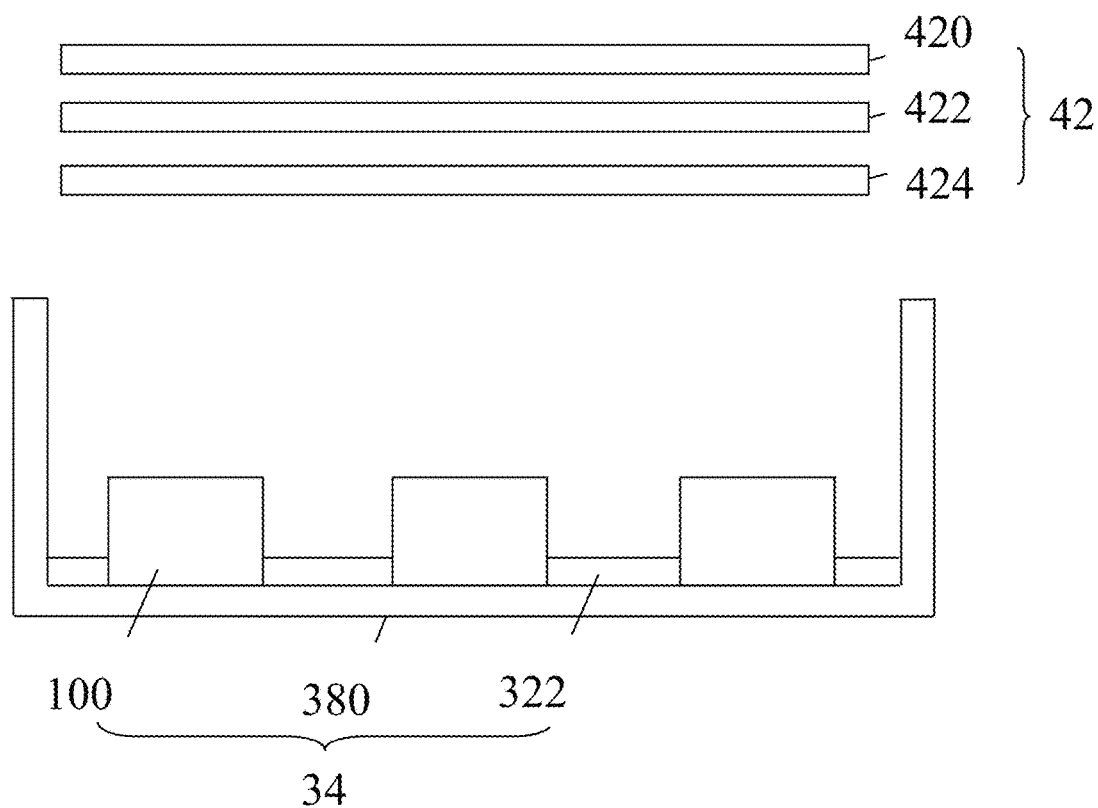
FIG. 9 is a schematic diagram illustrating a QD-LCD, in accordance with another embodiment of the present invention.

FIG. 9 is a schematic diagram illustrating a QD-LCD, in accordance with another embodiment of the present invention. The QD-LCD 54 comprises a direct-lit module 34 and an LCD 42. The direct-lit module 34 comprises a frame 380 and a backlight unit 100. In the present embodiments, the backlight unit 100 may be any QD-LED 100a, 100b, 100c of FIG. 5-7, and projecting light to the LCD 42. Moreover, some light from the backlight unit 100 may be reflected by a reflector 322 on the frame 380 to the LCD 42 and then penetrate the LCD 42.

In the embodiments of FIG. 8 and FIG. 9, the LCD 42 comprises a glass substrate 420, a thin-film transistor 424, and a layer of liquid-crystal molecules 422. The glass substrate 420 is configured on the thin-film transistor 424, in which the thin-film transistor 424 is further configured on the edge-lit module 32 or the direct-lit module 34. As for the layer of liquid-crystal molecules 422, it is configured between the glass substrate 420 and the thin-film transistor 424.

If the QD-LCD is comprised in a night vision imaging system (NVIS), the quantum dot material is preferred to be a green all-inorganic perovskite quantum dot characterized by the general formula $CsPbBr_3$ or an amber all-inorganic perovskite quantum dot characterized by the general formula $CsPb(I/Br)_3$. Such NVIS based on the QD-LCD is suitable for being used as the display panel in cockpits.

In the aforementioned QD-LCD, if the at least one quantum dot of quantum dot material is a green all-inorganic perovskite quantum dot characterized by the general formula $CsPbBr_3$ and/or a red all-inorganic perovskite quantum dot characterized by the general formula $CsPbI_3$ and used with follow phosphors $(Y_3Al_5O_{12}:Ce^{3+})$ or red phosphors $(K_2SiF_6:Mn^{4+})$, it can be configured in a wide-color gamut (WCG) display to provide wide-gamut color reproduction.

Figure 10:
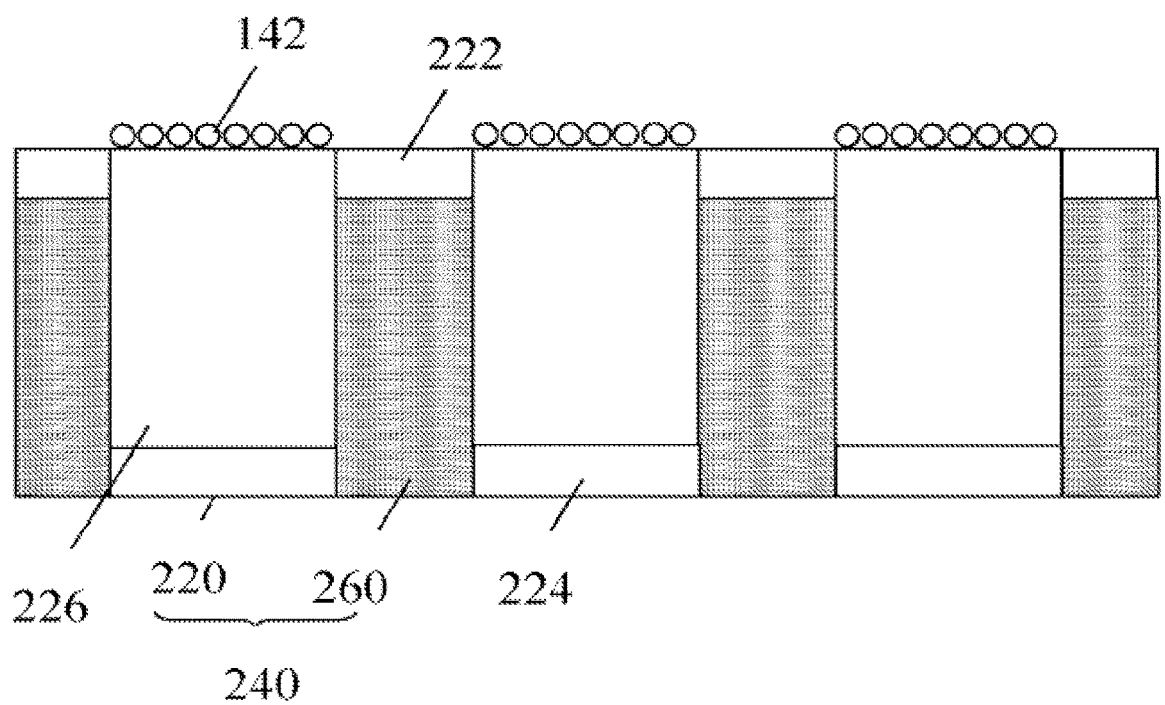
FIG. 10 is a schematic diagram illustrating the first micro-LED integrated with quantum dot, in accordance with some embodiments of the present invention.

FIG. 10 is a schematic diagram illustrating the first micro-LED integrated with quantum dot, in accordance with some embodiments of the present invention. The micro-LED display integrated with quantum dot 200a comprises a micro light-emitting unit 240 and at least one quantum dot material 142 disposed on the micro light-emitting unit 240. More particularly, the micro light-emitting unit 240 is an active-matrix micro light-emitting diode chip or a passive-matrix micro light-emitting diode chip. The at least one quantum dot material 142 comprises at least one quantum dot and a silicon oxide $(SiO_x)$ material covering on the at least one quantum dot. Similarly, the at least one quantum dot is a perovskite quantum dot, characterized by the general formula $MAX_3$, selected from the group consisting of an organic-inorganic hybrid perovskite quantum dot, an all-inorganic perovskite quantum dot, and the combination of both. The silicon oxide $(SiO_x)$ material may be made of $SiO_x$, $SiO_2$, or both.

Of the general formula $MAX_3$, the cation M is an organic cation (e.g., a methylamine cation, an ethylamine cation, a formamidine cation) or an inorganic cation (e.g., a cesium cation). The metal ion A is a divalent lead ion $(Pb^{2+})$, a divalent tin ion $(Sn^{2+})$, or a divalent germanium ion $(Ge^{2+})$. The halide ion X is a chloride ion $(Cl^-)$, a chloride ion $(Br^-)$, or an iodide ion $(I^-)$ in a cubic, orthorhombic, or tetragonal crystal system.

In some preferred embodiments, the all-inorganic perovskite quantum dot is a green all-inorganic perovskite quantum dot characterized by the general formula $CsPbBr_3$, a red all-inorganic perovskite quantum dot characterized by the general formula $CsPbI_3$, or the combination of both.

The micro light-emitting unit 240 comprises an LED chip 220 and multiple spacers 260. Moreover, at least one quantum dot material 142 is configured on the outlet of the LED chip 220, or applied on the surface of the outlet of the LED chip 220. The multiple spacers 260 are configured between the LED chip 220 and the at least one quantum dot material 142. In the micro light-emitting unit 240, the LED chip 200 is a lateral LED chip comprising a first electrode 222, a second electrode 224, and a tri-layer structure configured in-between. The tri-layer structure comprises a layer of P-type semiconductor (close to the first electrode 222), a luminous layer 226 (in the middle), and a layer of N-type semiconductor (close to the second electrode 224). The outlet of the LED chip 220 and the first electrode 222 are at the same side.

The at least one quantum dot material 142 is applied onto the surface of the micro light-emitting unit 240 by spray coating. The procedure includes mixing the at least one quantum dot material and a gel (e.g., silica gel) and then depositing the mixture on the surface of the micro light-emitting unit 240 by spray coating. The colors required for a single LED chip 220 can be automatically aligned and sprayed onto the LED chip 220 by a spray coating machine designed for use with quantum dot materials. Such micro-LED display integrated with quantum dot may be used to produce color display.

Figure 11:
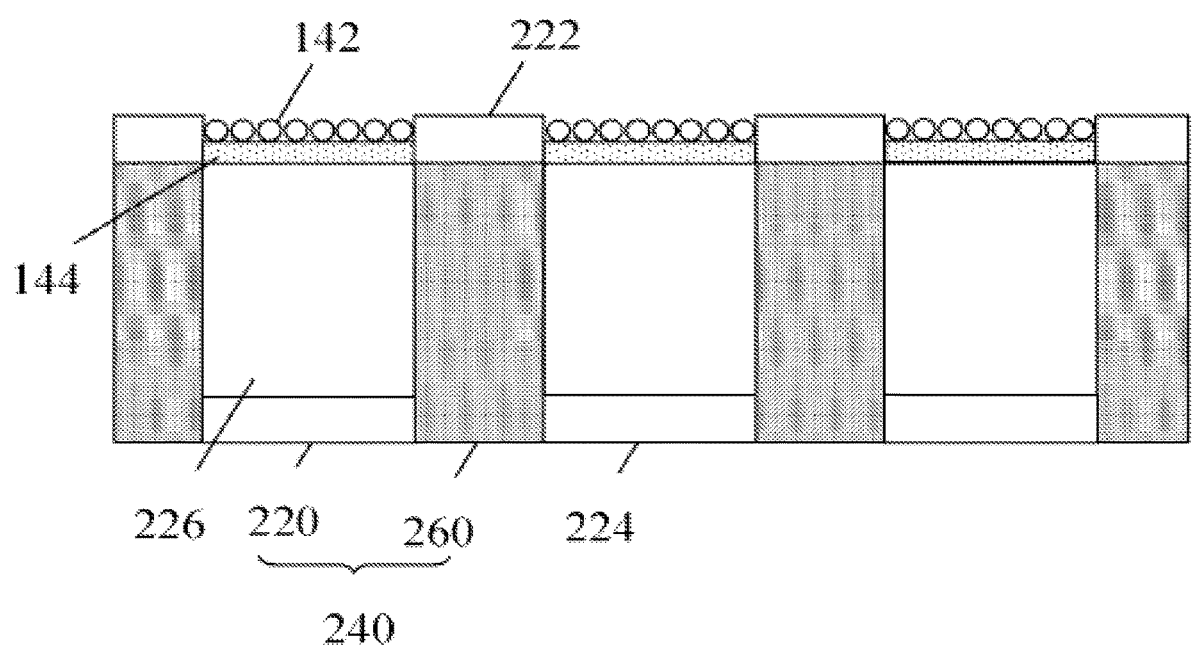
FIG. 11 is a schematic diagram illustrating the second micro-LED integrated with quantum dot, in accordance with some embodiments of the present invention.

FIG. 11 is a schematic diagram illustrating the second micro-LED integrated with quantum dot, in accordance with some embodiments of the present invention. The micro-LED display integrated with quantum dot 200b comprises a micro light-emitting unit 240 and at least one quantum dot material 142 disposed on the micro light-emitting unit 240. More particularly, the micro light-emitting unit 240 is an active-matrix micro light-emitting diode chip or a passive-matrix micro light-emitting diode chip. The at least one quantum dot material 142 comprises at least one quantum dot and a silicon oxide ($SiO_x$) material covering on the at least one quantum dot. The major difference between FIG. 10 and FIG. 11 is that the micro-LED display integrated with quantum dot 200b further comprises a photoresist layer 144 configured between the micro light-emitting unit 240 and the at least one quantum dot material 142. Such photoresist layer 144 may be a photoresist mask (PRM), a barrier layer, or the combination of both. As for the materials, the photoresist layer 144 may be made of poly(methyl methacrylate) (PMMA), positive photoresists (e.g., phenol-formaldehyde resin and epoxy resin), negative photoresists (e.g., polyisoprene rubber), or image reversal photoresists. Known examples of the photoresist layer 144 include the wavelength conversion film 140 and the layer of wavelength conversion complex in FIG. 7 and FIG. 8.

In the embodiment of FIG. 11, the photoresist layer 144 is configured between the micro light-emitting unit 240 and the at least one quantum dot material 142 by the use of spray coating and photolithography. In combination of the spray coating of green and red wavelength conversion materials, a color display based on micro-LED display integrated with quantum dot may be produced.

Figure 12:
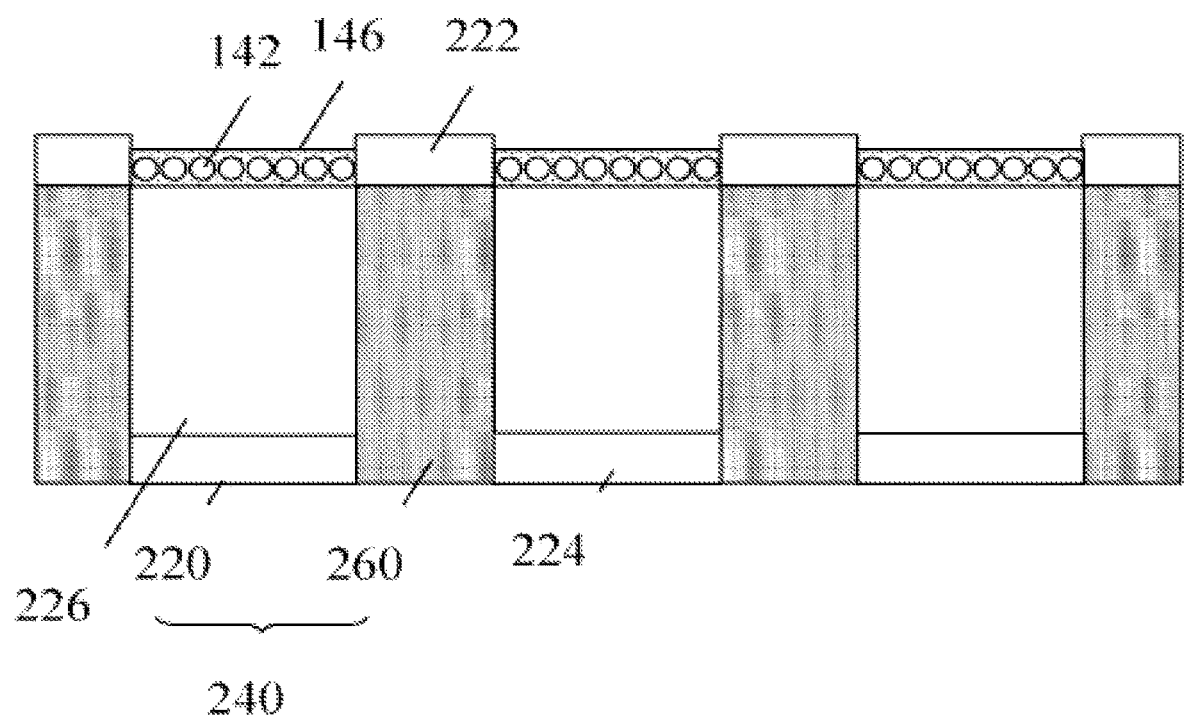
FIG. 12 is a schematic diagram illustrating the third micro-LED integrated with quantum dot, in accordance with some embodiments of the present invention.

FIG. 12 is a schematic diagram illustrating the third micro-LED integrated with quantum dot, in accordance with some embodiments of the present invention. The micro-LED display integrated with quantum dot 200c comprises a micro light-emitting unit 240 and at least one quantum dot material 142 disposed on the micro light-emitting unit 240. More particularly, the micro light-emitting unit 240 is an active-matrix micro light-emitting diode chip or a passive-matrix micro light-emitting diode chip. The at least one quantum dot material 142 comprises at least one quantum dot and a silicon oxide ($SiO_x$) material covering on the at least one quantum dot. The major difference between FIG. 11 and FIG. 12 is that the micro-LED display integrated with quantum dot 200c comprises a layer of photoresist complex 146 made of the at least one quantum dot material 142 and a photoresist material. Such photoresist material may be a photoresist mask (PRM), a barrier layer, or the combination of both. As for the materials, the photoresist layer 144 may be made of poly(methyl methacrylate) (PMMA), positive photoresists (e.g., phenol-formaldehyde resin and epoxy resin), negative photoresists (e.g., polyisoprene rubber), or image reversal photoresists. Known examples of the photoresist layer 146 include the wavelength conversion film 140 and the layer of wavelength conversion complex in FIG. 7 and FIG. 8.

In the embodiment of FIG. 12, a color display based on the micro-LED display integrated with quantum dot 200c can be achieved by the use of spin coating and photolithography. The quantum dot material 142 in some embodiments of the present invention is soluble in non-polar solvent. By manipulating the solubility of PMMA in methylbenzene, the viscosity of the layer of photoresist complex 146 of the quantum dot material 142 and PMMA can be adjusted. It is thus clear that by using spin coating to apply the layer of photoresist complex 146 onto the micro light-emitting module 240 and using photolithography to affix the quantum dot material, the color display in FIG. 12 can be produced.

If the quantum dot material of the aforementioned micro-LED display integrated with quantum dot is a green all-inorganic perovskite quantum dot characterized by the general formula $CsPbBr_3$ and/or an amber all-inorganic perovskite quantum dot characterized by the general formula $CsPb(I/Br)_3$, the micro-LED display integrated with quantum dot may be integrated into an NVIS as a QD display of the NVIS.

In the aforementioned micro-LED display integrated with quantum dot, if the at least one quantum dot of quantum dot material is a green all-inorganic perovskite quantum dot characterized by the general formula $CsPbBr_3$ and/or a red all-inorganic perovskite quantum dot characterized by the general formula $CsPbI_3$ and used with follow phosphors ($Y_3Al_5O_{12}:Ce^{3+}$) or red phosphors ($K_2SiF_6:Mn^{4+}$), it can be configured in a wide-color gamut (WCG) display to provide wide-gamut color reproduction.

Figure 13:
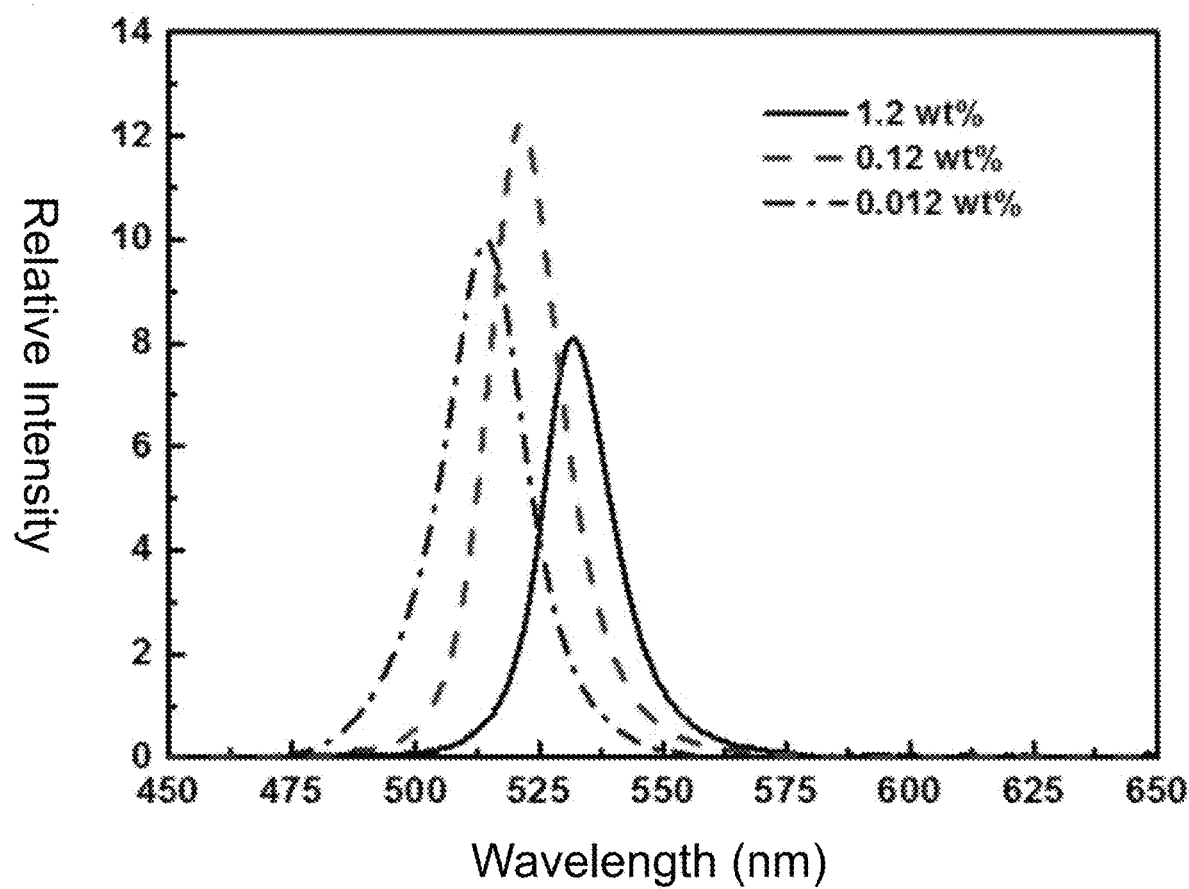
FIG. 13 is a graph showing the spectra of quantum dot materials with different weight percentages of the included quantum dots, in accordance with some embodiments of the present invention.
Figure 14:
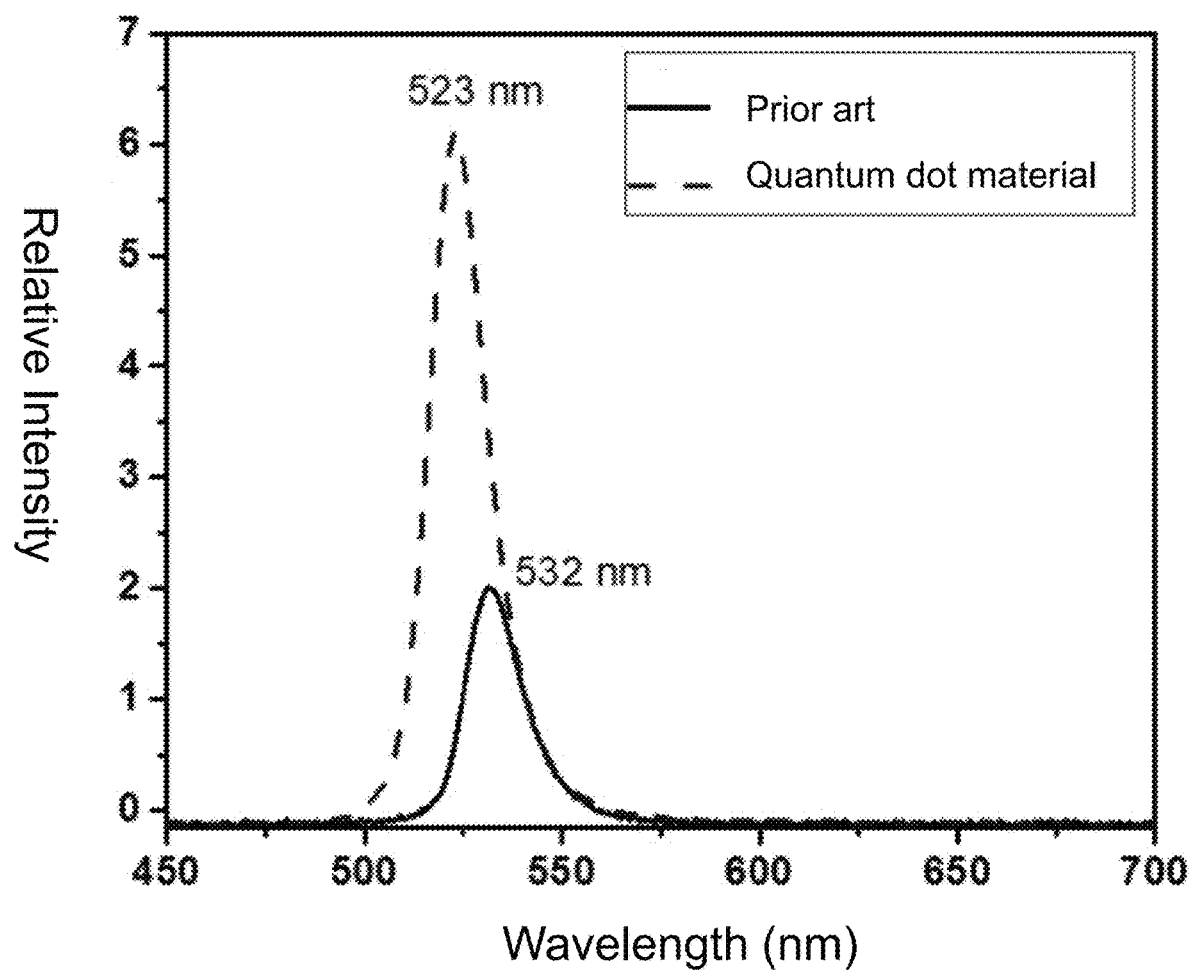
FIG. 14 is a graph showing the comparison between one prior art and the quantum dot material in one embodiment.

Referring to FIG. 13 and FIG. 14. FIG. 13 is a graph showing the spectra of quantum dot materials with different weight percentages of the included quantum dots, in accordance with some embodiments of the present invention. FIG. 14 is a graph showing the comparison between one prior art and the quantum dot material in one embodiment. In FIG. 13, the emission spectra are different among the quantum dot materials with different weight percentages of the quantum dots. For example, the peak (the wavelength with the highest intensity) falls at around 530 nm, if there are 1.2 wt % quantum dots in a quantum dot material. The peak shifts to 520 nm if there are 0.12 wt % quantum dots in a quantum dot material. The peak shifts to 513 nm if there are 0.012 wt % quantum dots in a quantum dot material. It is clear that the emission spectra of quantum dot materials can reach the same wavelength by manipulating the concentrations of quantum dots, no matter the quantum dots are with or without $SiO_x$ materials.

It has been observed in FIG. 14 that the emission spectra can also be adjusted by the $SiO_x$ material coating on the quantum dots even when the concentrations of quantum dots are at the same level. The quantum dots covered by a $SiO_x$ material (i.e., the quantum dot material in some embodiments of the present invention) show its peak at 523 nm. However, the quantum dots without the present of the $SiO_x$ material (i.e., a prior quantum dot material) shows its peak at 532 nm.

Figure 15A:
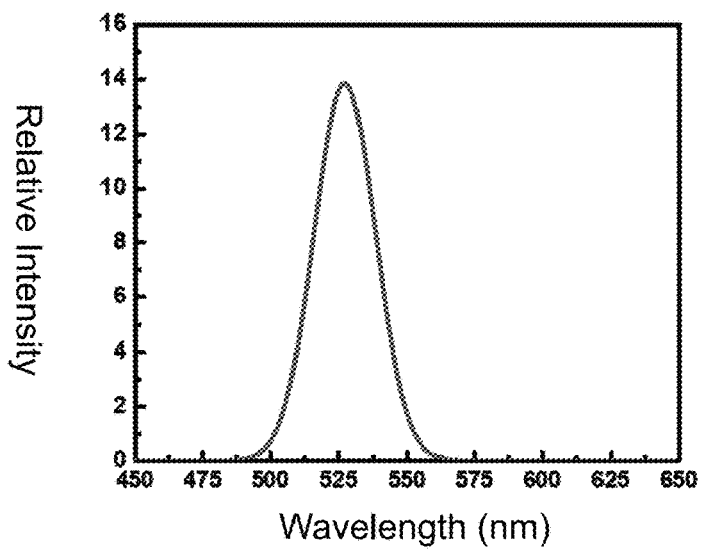
FIG. 15A is a graph representing the spectrum of a green all-inorganic perovskite quantum dot, in accordance with some embodiments of the present invention.
Figure 15B:
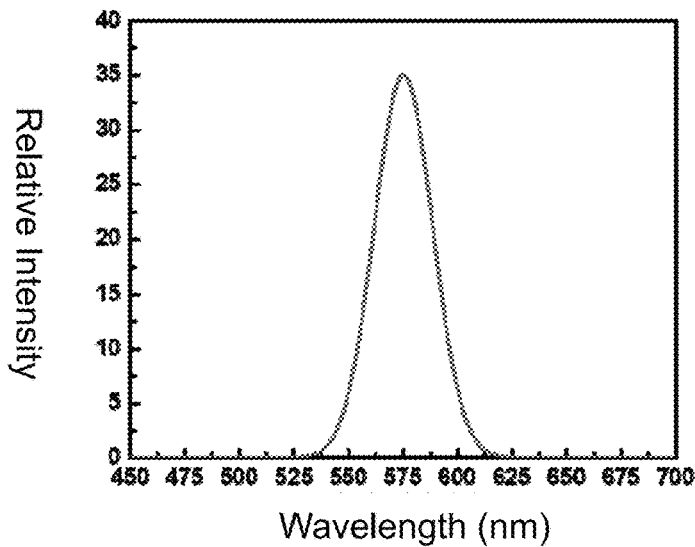
FIG. 15B is a graph representing the spectrum of an amber all-inorganic perovskite quantum dot, in accordance with some embodiments of the present invention.
Figure 15C:
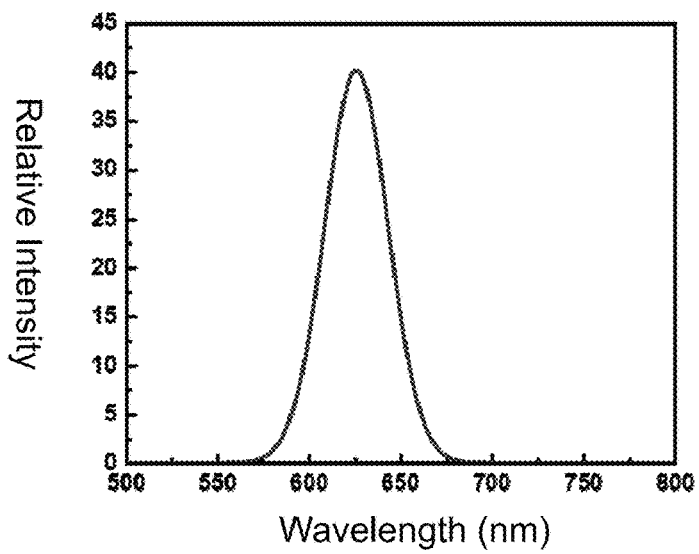
FIG. 15C is a graph representing the spectrum of a red all-inorganic perovskite quantum dot, in accordance with some embodiments of the present invention.
Figure 16A:
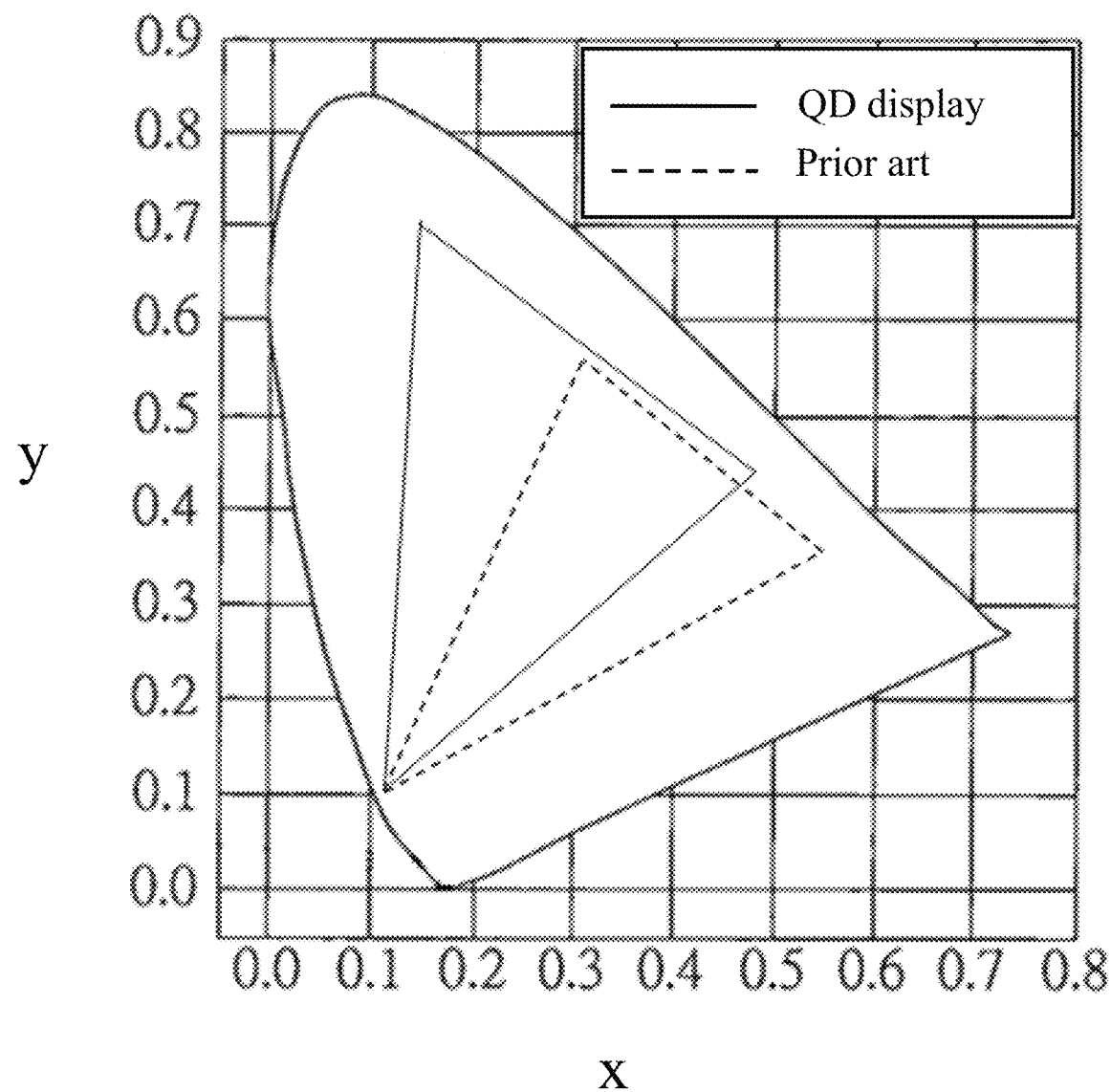
FIG. 16A is a graph comparing the gamut of one prior NVIS and a NVIS based on the QD of one embodiment of the present invention.
Figure 16B:
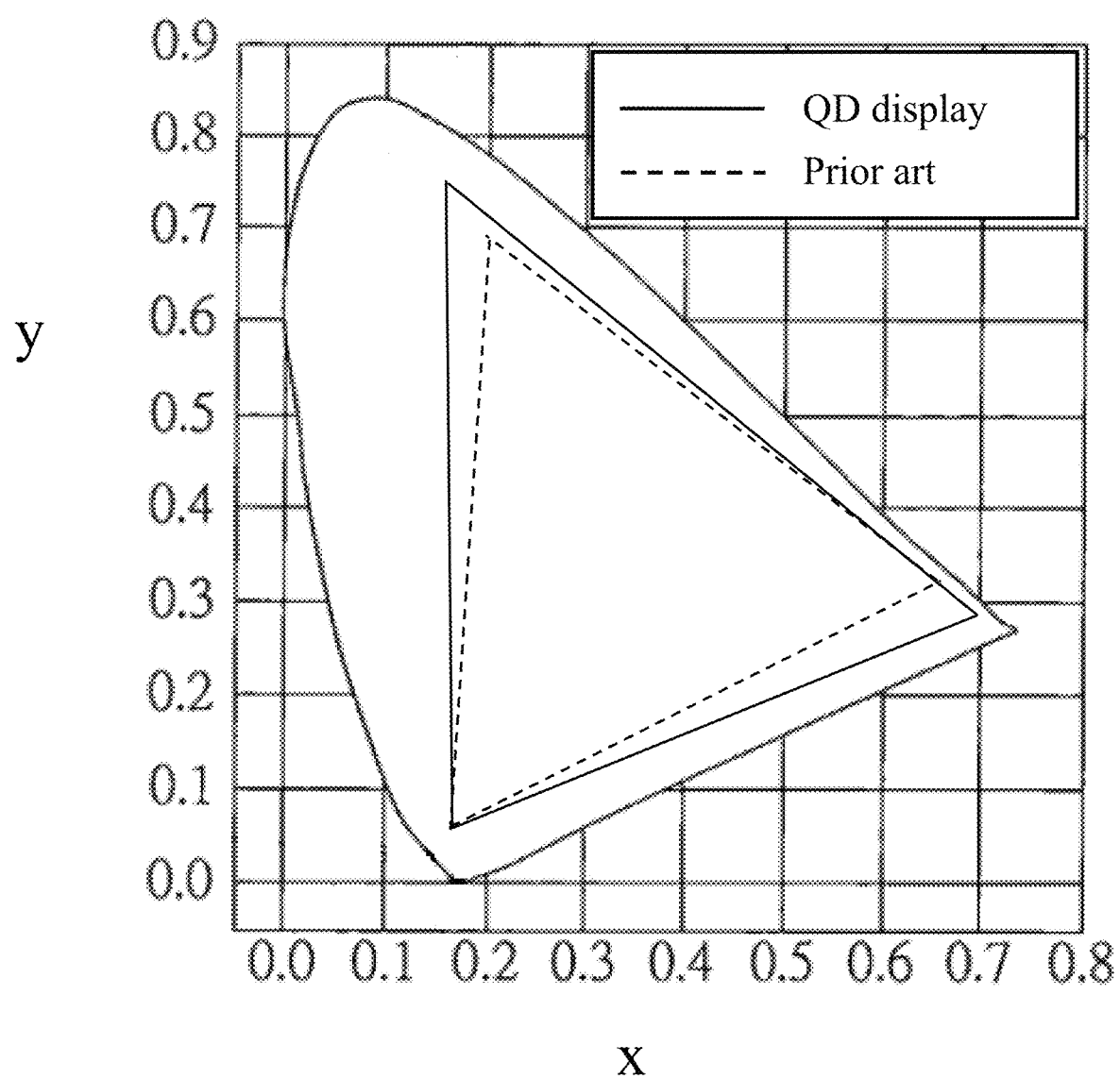
FIG. 16B is a graph comparing the gamut of one prior wide-gamut display and a wide-gamut display based on the QD of one embodiment of the present invention.

Referring to FIGS. 15A, 15B, 15C, 16A, and 16B. FIG. 15A is a graph representing the spectrum of a green all-inorganic perovskite quantum dot, in accordance with some embodiments of the present invention. FIG. 15B is a graph representing the spectrum of an amber all-inorganic perovskite quantum dot, in accordance with some embodiments of the present invention. FIG. 15C is a graph representing the spectrum of a red all-inorganic perovskite quantum dot, in accordance with some embodiments of the present invention. FIG. 16A is a graph comparing the gamut of one prior NVIS and a NVIS based on the QD display of one embodiment of the present invention. FIG. 16B is a graph comparing the gamut of one prior wide-gamut display and a wide-gamut display based on the QD-LCD of one embodiment of the present invention.

In FIG. 15A, the green all-inorganic perovskite quantum dot characterized by the general formula $CsPbBr_3$ has a peak at 530 nm with an about 20 nm FWHM on the photoluminescence excitation (PLE) graph. Similarly, in FIG. 15B, the amber all-inorganic perovskite quantum dot characterized by the general formula $CsPb(I/Br)_3$ has a peak at 575 nm with an about 30 nm FWHM on the PLE graph. As for the PLE graph of FIG. 15C, it shows red all-inorganic perovskite quantum dot characterized by the general formula $CsPbI_3$ has a peak at 630 nm, in which its FWHM is about 30 nm.

In FIG. 16A, the QD display of one embodiment and used in a NVIS is measured by the NTSC color gamut standard (in a 1931 CIE diagram) and produce an 84.6% NTSC color gamut (the area enclosed by a solid line in FIG. 16A). However, one prior display in the same test only produce a 57.2% NTSC color gamut (the area enclosed by a broken line in FIG. 16A). Accordingly, the QD display of the embodiment has a color gamut nearly 1.5 times higher than the prior art.

In FIG. 16B, the QD display is further subjected to the Rec. 2020 test and found to provide about 90% of the Rec.2020 color gamut (the area enclosed by a solid line in FIG. 16B, which is more than 130% NTSC color gamut). The prior display, on the other hand, only provides about 70% of the Rec.2020 color gamut (the area enclosed by a broken line in FIG. 16B, which is more than 90% NTSC color gamut). Accordingly, the QD display of the embodiment has a color gamut nearly 1.3 times higher than the prior art on the Rec.2020 color gamut.

Figure 17:
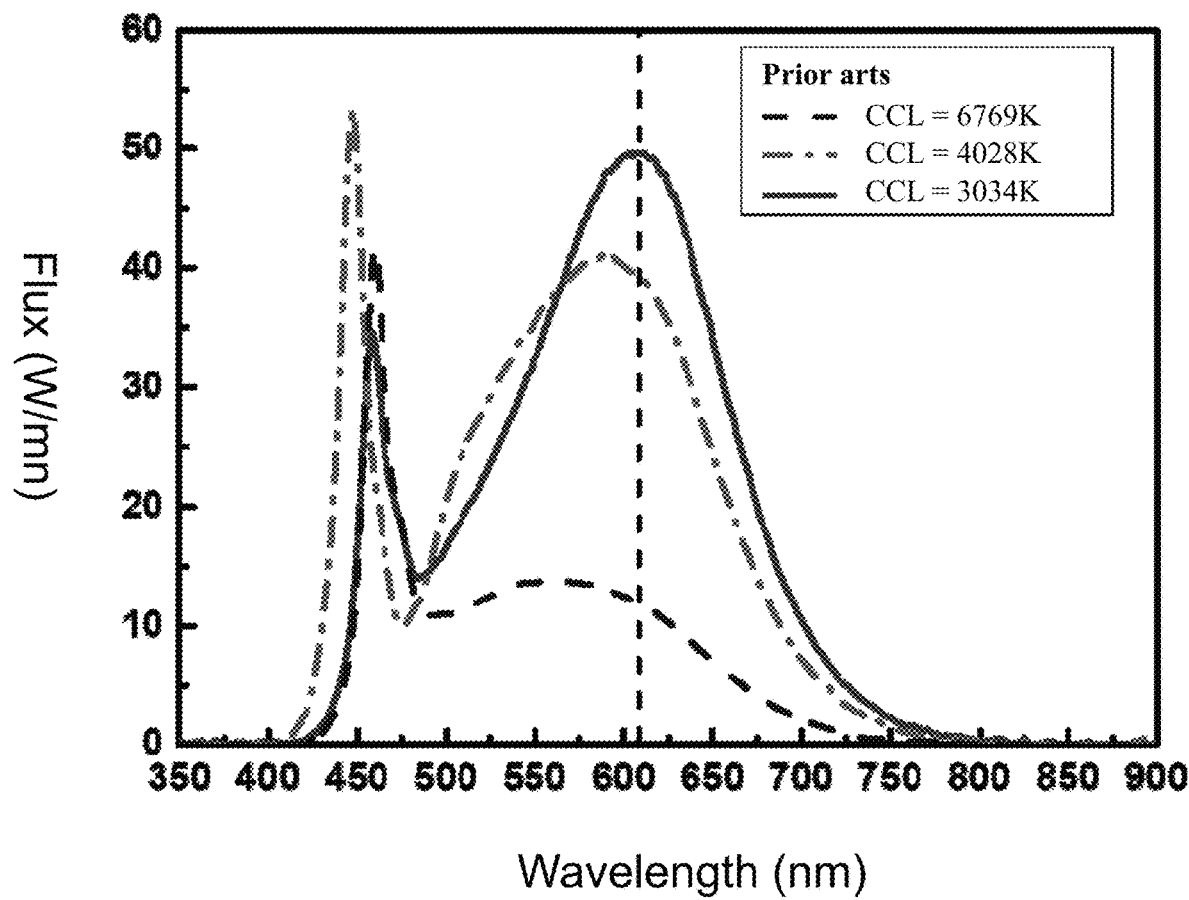
FIG. 17 is a graph showing the spectra of different prior white-light LEDs.

FIG. 17 and Table 1 show the color temperatures of prior white-light LEDs and their $NR_A$ and $NR_B$ values. Based on the data, all prior white-light LEDs fail to meet the requirements (i.e., $1.0 \leq NR_A \leq 1.7E-10$ for Class A NVIS or $1.0 \leq NR_B \leq 1.6E-10$ for Class B NVIS) specified in the MIL-STD-3009 document, entitled as "LIGHTING, AIRCRAFT, NIGHT VISION IMAGING SYSTEM (NVIS) COMPATIBLE." Accordingly, these prior arts are not compatible with NVIS.

TABLE 1

| Prior white-light LED (CCT) | $NR_A$ | $NR_B$ |
|---|---|---|
| 6769K | 1.61E–06 | 9.58E–07 |
| 4028K | 2.12E–06 | 1.77E–06 |
| 3040K | 2.89E–06 | 1.27E–06 |

However, the QD displays, in the embodiments of the present invention, used in NVIS meet the requirements for both Class A and Class B NIVS. All the QD displays have peaks at the wavelengths below 600 nm.

There are many inventions described and illustrated above. The present inventions are neither limited to any single aspect nor embodiment thereof, nor to any combinations and/or permutations of such aspects and/or embodiments. For the sake of brevity, many of those permutations and combinations will not be discussed separately herein.

What is claimed is:

1. A method of manufacturing quantum dot materials, comprising:
   providing a quantum dot solution having a first volume and a silicon compound having a second volume;
   introducing the quantum dot solution and the silicon compound to a cross-linking agent and an ammonia solution ($NH_4OH$) having a third volume; and
   obtaining quantum dot materials.

2. The method of manufacturing quantum dot materials as claimed in claim 1, wherein the quantum dot solution comprises at least one quantum dot.

3. The method of manufacturing quantum dot materials as claimed in claim 2, wherein the at least one quantum dot is a perovskite quantum dot characterized by the general formula $MAX_3$, wherein M is a cation, A is a metal ion, and X is a halide ion, and wherein the perovskite quantum dot is one selected from the group consisting of an organic-inorganic hybrid perovskite quantum dot, an all-inorganic perovskite quantum dot, and the combination thereof.

4. The method of manufacturing quantum dot materials as claimed in claim 3, wherein the all-inorganic perovskite quantum dot is one selected from the group consisting of a green all-inorganic perovskite quantum dot characterized by the general formula $CsPbBr_3$, an amber all-inorganic perovskite quantum dot characterized by the general formula $CsPb(I/Br)_3$, a red all-inorganic perovskite quantum dot characterized by the general formula $CsPbI_3$, and the combination thereof.

5. The method of manufacturing quantum dot materials as claimed in claim 4, wherein the first volume is 5 ml or 10 ml.

6. The method of manufacturing quantum dot materials as claimed in claim 4, wherein the silicon compound is tetraethyl orthosilicate (TEOS), tetramethyl orthosilicate (MEOS), or 3-aminopropyltriethoxysilane (APTES).

7. The method of manufacturing quantum dot materials as claimed in claim 4, wherein the second volume is 600 µl or 2000 µl.

8. The method of manufacturing quantum dot materials as claimed in claim 4, wherein the cross-linking agent is prepared by dissolving polyoxyethylene (5) nonylphenyl ether in cyclohexane or dissolving polyoxyethylene (5) nonylphenyl ether in hexane.

9. The method of manufacturing quantum dot materials as claimed in claim 4, wherein the third volume is 800 µl or 2000 µl.

10. The method of manufacturing quantum dot materials as claimed in claim 2, wherein the at least one quantum dot is between 0.001 wt % and 10 wt % of the quantum dot material.

11. The method of manufacturing quantum dot materials as claimed in claim 1, wherein the quantum dot materials comprising:
    at least one quantum dot; and
    a silicon oxide material, covering on the at least one quantum dot;
    wherein the at least one quantum dot is a perovskite quantum dot characterized by the general formula $MAX_3$; and
    wherein M is a cation, A is a metal ion, and X is a halide ion.

12. The method of manufacturing quantum dot materials as claimed in claim 11, wherein the perovskite quantum dot is one selected from the group consisting of an organic-inorganic hybrid perovskite quantum dot, an all-inorganic perovskite quantum dot, and the combination thereof.

13. The method of manufacturing quantum dot materials as claimed in claim 12, wherein the all-inorganic perovskite quantum dot is one selected from the group consisting of a green all-inorganic perovskite quantum dot characterized by the general formula $CsPbBr_3$, an amber all-inorganic perovskite quantum dot characterized by the general formula $CsPb(I/Br)_3$, a red all-inorganic perovskite quantum dot characterized by the general formula $CsPbI_3$, and the combination thereof.

14. The method of manufacturing quantum dot materials as claimed in claim 11, wherein the silicon oxide material is made of silicon dioxide ($SiO_2$).

15. The method of manufacturing quantum dot materials as claimed in claim 11, wherein the at least one quantum dot is between 1 nm and 30 nm in size.

16. The method of manufacturing quantum dot materials as claimed in claim 11, wherein the quantum dot material is between 30 nm and 1000 nm in size.

* * * * *